United States Patent [19]
Eustis et al.

[11] Patent Number: 5,920,222
[45] Date of Patent: Jul. 6, 1999

[54] TUNABLE PULSE GENERATOR BASED ON A WAVE PIPELINE

[75] Inventors: Steven M. Eustis, Essex Junction; Dale E. Pontius, Colchester, both of Vt.

[73] Assignee: International Business Machines Corporation, Armonk, N.Y.

[21] Appl. No.: 08/839,219

[22] Filed: Apr. 22, 1997

[51] Int. Cl.⁶ .................................................. H03K 5/14
[52] U.S. Cl. ........................ 327/269; 327/277; 327/176
[58] Field of Search .................................. 327/165, 166, 327/170–176, 217, 225, 263, 269–271, 276–277, 284, 291, 293

[56] References Cited

U.S. PATENT DOCUMENTS

| | | | |
|---|---|---|---|
| 4,618,787 | 10/1986 | Jacksier et al. .......................... | 327/277 |
| 4,800,295 | 1/1989 | Minuhin et al. ........................ | 327/176 |
| 5,059,818 | 10/1991 | Witt et al. ................................ | 327/217 |
| 5,065,041 | 11/1991 | Moles ....................................... | 327/271 |
| 5,083,049 | 1/1992 | Kagey ...................................... | 327/141 |
| 5,333,154 | 7/1994 | Hengeveld et al. ..................... | 375/106 |
| 5,412,697 | 5/1995 | Van Brunt et al. ..................... | 375/360 |
| 5,422,585 | 6/1995 | Fan Chiangi et al. .................. | 327/170 |
| 5,465,062 | 11/1995 | Fong ........................................ | 327/172 |
| 5,467,053 | 11/1995 | Wuidart et al. .......................... | 327/551 |
| 5,528,177 | 6/1996 | Sridhar et al. ........................... | 326/113 |
| 5,539,348 | 7/1996 | Young ..................................... | 327/262 |
| 5,546,034 | 8/1996 | Han ......................................... | 327/174 |
| 5,566,129 | 10/1996 | Nakashima et al. .................... | 327/217 |
| 5,708,382 | 1/1998 | Park ........................................ | 327/277 |
| 5,729,169 | 3/1998 | Roohparvar ............................ | 327/227 |

FOREIGN PATENT DOCUMENTS 6-188698  7/1994  Japan .

*Primary Examiner*—My-Trang Nu Ton
*Attorney, Agent, or Firm*—Ratner & Prestia; Robert A. Walsh

[57] ABSTRACT

A pulse generator comprising a delay circuit uses a series of "n" delay stages to generate pulses that do not have distorted duty cycles. The output of the delay stage "n" feeds back to reset the delay stage "n−2". The output of each of the delay stages initially changes from a first logic state to a second logic stage at the leading edge of a pulse. The output of each delay stage switches back to the first logic state, or the trailing edge of the pulse, upon receipt of the feedback signal from a subsequent delay stage. The wave characteristics depend only on the rising edge of the pulse because the rising edge of the pulse of a future stage generates the falling edge of the current stage.

16 Claims, 12 Drawing Sheets

FIG. 3A PRIOR ART — RESET_

FIG. 3B PRIOR ART — T0

FIG. 3C PRIOR ART — DWL

FIG. 3D PRIOR ART — TOR_

FIG. 3E PRIOR ART — WE (READ)(WRITE)

FIG. 3F PRIOR ART — TOW_

FIG. 3G PRIOR ART — PULSE $t_{TOR}$

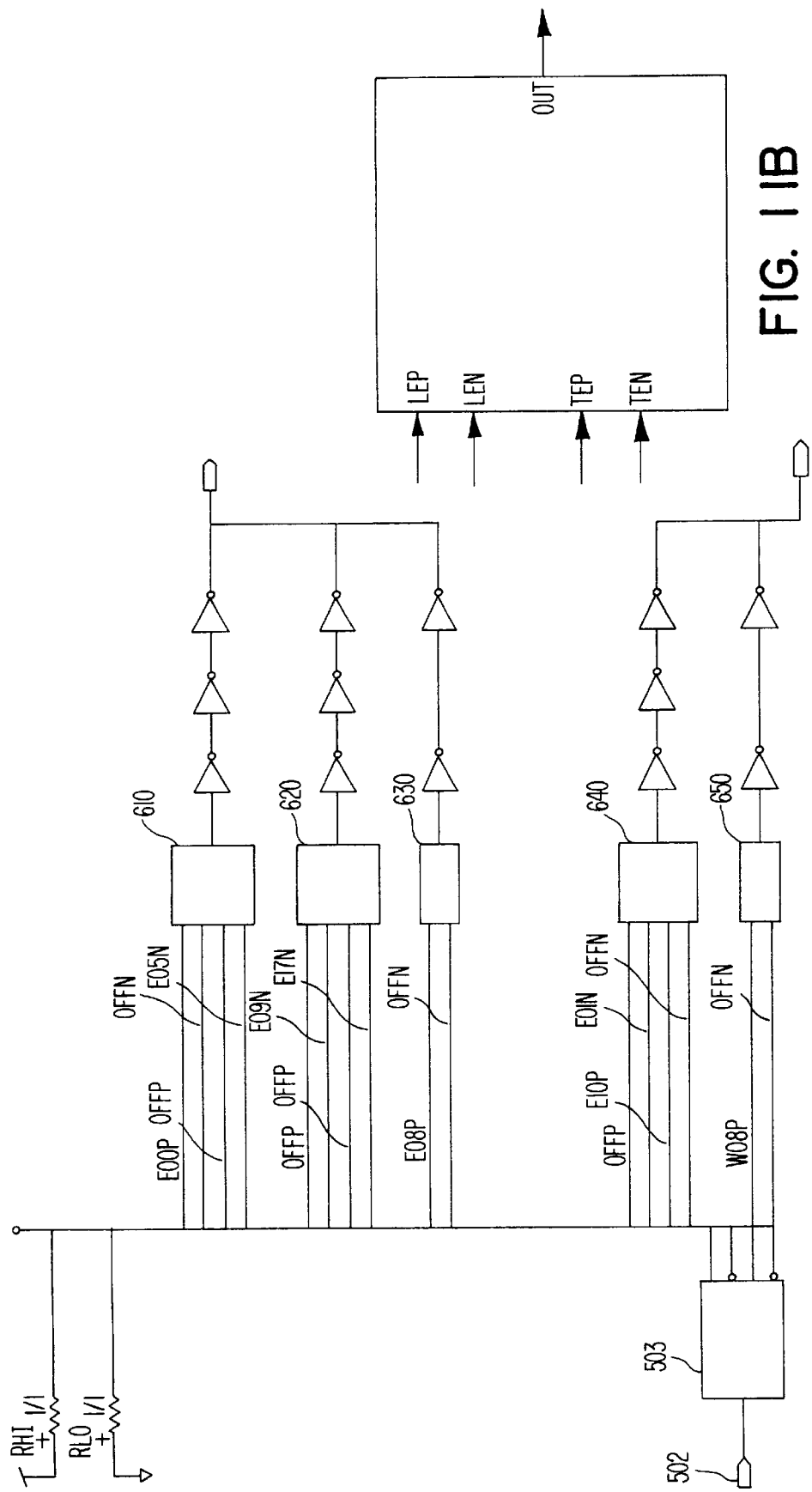

TUNABLE PULSE GENERATOR BASED ON A WAVE PIPELINE

FIELD OF THE INVENTION

The present invention relates in general to a pulse generator and, more particularly, to a pulse generator that is tunable based on a wave pipeline.

BACKGROUND OF THE INVENTION

In the field of electrical systems, a signal having a desired pulse width is frequently the input signal of other circuits of the electrical system.

FIG. 1 is a circuit diagram of a conventional pulse generator. In FIG. 1, the conventional pulse generator consists of a delay element 66; inverters 67, 69, 71; and NAND gates 68, 70, 72. The delay element 66 is reset in response to a reset signal RESET_, and outputs a delay signal DWL. The inverter 67 inverts an output signal of the delay element 66 and outputs a signal TOR_. The inverter 69 inverts and outputs a write enable signal WE. The inverter 71 delays an output signal of the delay element 66 and outputs a signal TOW_. NAND gate 68 performs a NAND-operation of the signal TOR_, a signal DWL, and an output signal of the inverter 69 and outputs a NAND-operated signal. NAND gate 70 performs a NAND operation of the write enable signal WE, a signal TO, and the signal TOW_, and outputs its NAND-operated signal. NAND gate 72 performs a NAND operation of the output signals of NAND gates 68, 70, and a signal SETPLS and outputs an output signal PULSE.

FIG. 2 is a detailed circuit diagram of the delay element 66 shown in FIG. 1. In FIG. 2, the delay element 66 consists of a NAND gate 80, an inverter 81, and a capacitor 82. NAND gate 80 performs a NAND operation of two input signals and outputs a NAND-operated signal. Capacitor 82 is connected between an output terminal of NAND gate 80 and a ground. Inverter 81 inverts an output signal of NAND gate 80 and outputs the inverted signal.

FIGS. 3A–G illustrate an operational timing diagram for explaining an operation of the conventional pulse generator shown in FIG. 1. The operation of the pulse generator will be explained in reference to a read mode and a write mode. The read mode and write mode are controlled by the write enable signal WE as shown in FIG. 3E. The pulse generator is operated during the write mode when the write enable signal WE is a "high" level. In contrast, during the read mode, the write enable signal is a "low" level.

When the write enable signal WE is a "low" level (the read mode), and if a reset signal RESET_ transmits from the "low" level to the "high" level as shown in FIG. 3A, the delay element 66 can be operated. At this time, if the signal TO of a "high" level is provided as input as shown in FIG. 3B, the inverter 67 inverts the signal delayed by the delay element 66 and outputs a signal TOR_ of a "low" level as shown in FIG. 3D. The inverter 71 inverts the signal delayed by the delay element 66 and outputs the signal TOW_ of a "low" level as shown in FIG. 3F. The NAND gate 70 performs a NAND operation of the signal TO of a "high" level, the write enable signal WE of a "low" level, and the signal TOW_ of a "low" level, and outputs a signal of a "high" level. The NAND gate 68 outputs a signal of a "high" level because the write enable signal WE is a "low" level. Accordingly, NAND gate 72 outputs an output signal PULSE of a "high" level as shown in FIG. 3G, regardless of the state of a signal SETPLS. The NAND gate 70 performs a NAND operation of the signal TO, the write enable signal WE, and the signal TOW_ of a "low" level, and outputs a signal of a "high" level. The NAND gate 72 performs a NAND operation of the output signals of the NAND gates 68, 70, and the signal SETPLS of a "high" level, and drives the output signal PULSE to a "low" level. By performing the above operation, the pulse generator can generate a pulse having a short pulse length in the read mode.

When the write enable signal WE is a "high" level of the write mode, and the reset signal RESET_ transits from a "low" level to a "high" level as shown in FIG. 3A, the delay element 66 delays the signal DWL for a predetermined time period and outputs the delayed signal as shown in FIG. 3C. The inverter 71 inverts the signal delayed by the delayed element 66 and outputs a signal TOW_ as shown in FIG. 3F. The NAND gate 70 performs a NAND operation of the signal TO, the write enable signal, and the signal TOW_ of a "high" level and outputs a signal of a "low" level. The NAND gate 68 outputs a signal of a "high" level while the output signal of the inverter 69 maintains a "low" level. The NAND gate 72 performs a NAND operation of the output signal of NAND gate 68 of a "high" level and the output signal of the NAND gate 70 of a "low" level, and a signal SETPLS and outputs the output signal PULSE of a "high" level as shown in FIG. 3G. By performing the above operation, the pulse generator can generate a pulse having a long pulse length in the write mode.

Conventional logic circuit design techniques contemplate increasing the throughput of a system with a "pipeline." The pipeline has a number of logic sections, each separated by a register section. Each system clock transition allows a signal to propagate from one register section, through the following logic section, and to the inputs of the following register section. Typically, new signal inputs are not fed into a logic section until the previous signal outputs are latched into the register section following that logic section. The maximum clock frequency for a logic section (i.e., the frequency with which new data can be switched into a logic section) is limited by the maximum propagation delay of a path through that logic section.

One way to increase system throughput is to break up logic sections into smaller sections (each with a shorter propagation delay) and insert pipeline register-section levels to separate the smaller logic sections. The clock speed can then be increased to take advantage of the shorter logic-section delays.

This "pipelining" technique has been used to obtain significant speed-up of a computer system. FIG. 4A illustrates conventional pipelining, showing the edges of signals propagating though small combinational-logic blocks. Conventionally, a combinational-logical-function unit is partitioned into several smaller combinational-logic blocks, and register stages are inserted between adjacent combinational-logic blocks as the synchronizers. The inserted register stages contribute to increased physical area and added clock-distribution requirements, however, and limit performance.

The increasing demand for high-speed, compact devices and systems, and the limitations of existing design methods, have prompted researchers to look for alternate techniques that can lead to high-performance digital systems. One such method is called "wave pipelining." Wave pipelining eliminates intermediate register stages in a pipeline system by using the internal capacitance of a combinational block for storage. Wave pipelined systems have strict requirements, however, on (a) the uniformity of path delays, (b) the uniformity of output-signal rise and fall times, and (c) the independence of delay from the pattern of input signal transitions.

FIG. 4B shows one embodiment of a conventional wave pipelining technique. In FIG. 4B, the internal capacitances in the combinational logic act in effect as temporary storage elements. These dynamic storage elements take the place of static registers used in the conventional pipelining method shown in FIG. 4A. Under the approach shown in FIG. 4B, new data values are latched in before the previous data values propagate to the next set of registers. In this way, there are multiple coherent data "waves" within the combinational-logic block. Hence, the system clock is much faster than the propagation delay of the combinational-logic block between adjacent system-clocked-register stages.

The significant advantages of wave pipelining are: (1) achieving very high pipeline rates that approach the physical speed limit of the technology, (2) increasing pipeline rate without significant latency increase, (3) minimizing clock loading and reducing clock-distribution problems, and (4) using fewer registers and reducing the area overhead otherwise required by conventional pipelining.

To obtain a high operating speed, each path through a given functional block must have similar path delays. This requires symmetric rise and fall times (collectively called "transition" times) of output signals and, for each component within the logical-functional block, delays that are independent of the input-signal transition patterns. Wave pipelined systems are susceptible to process and environmental variations which cause propagation-delay-variation problems.

Conventional delay circuits have a tendency to distort an original waveform and stretch or shrink the duty cycle so that the pulse ultimately vanishes. In other words, a pulse is broadened or narrowed, such that the time between a rising edge and a succeeding falling edge is increased or decreased. FIG. 5 shows each stage in a traditional wave pipe having increasing trailing edge uncertainty. Conventionally, each stage distorts the waveform slightly and a long, serial chain of delays causes significant distortion, especially with respect to the trailing edge. Moreover, conventional delay circuits do not offer a programmable pulse width adjustment.

Although the art of pulse generators is well developed, there remain some problems inherent in this technology. One particular problem is the distortion of a waveform by the delay circuit. Therefore, a need exists for a variable delay circuit for the internal clock of the chip that is easily adjustable.

SUMMARY OF THE INVENTION

The present invention provides a pulse generator circuit that is tunable based on a wave pipeline to produce undistorted waveforms in the stages of the pipeline. According to one aspect of the present invention, an input means generates a pulse having a predetermined pulse width; a flip-flop receives the pulse from the input means and generates a flip-flop output signal; a first delay stage has an input terminal coupled to the flip-flop, receives the flip-flop output signal, and generates a first delay stage output signal which changes state from a first logic state to a second logic state after a first predetermined amount of time and which changes state from the second logic state to the first logic state upon receipt of a reset signal, wherein the first delay stage output signal is fed back to the flip-flop to reset the flip-flop output signal; a second delay stage receives the first delay stage output signal and generates a second delay stage output signal which changes state from a first logic state to a second logic state after a second predetermined amount of time; and feedback means, coupled to the second delay stage, provides the second delay stage output signal to a reset terminal of the first delay stage to trigger the first delay stage output signal to change back to the first logic state.

According to another aspect of the present invention, a delay circuit for a pulse generator comprises "n" delay stages, n being an integer greater than 1, and each delay stage has an input terminal, a reset terminal for receiving a reset signal, and an output terminal for generating a delay stage output signal which changes state from a first logic state to a second logic state after a predetermined amount of time and which changes state from the second logic state to the first logic state upon receipt of the reset signal, wherein the delay stage output signal from the (n−i) stage is fed back to the reset terminal of the (n−(i+j)) stage as the reset signal, i being a whole number between 0 and (n−2), and j being an integer between 1 and (n−i−1).

The foregoing and other aspects of the present invention will become apparent from the following detailed description of the invention when considered in conjunction with the accompanying drawings.

BRIEF DESCRIPTION OF THE DRAWINGS

FIGS. 3A–G illustrate an operational timing diagram for explaining an operation of the conventional pulse generator shown in FIG. 1;

FIG. 11A is a block diagram of a further exemplary embodiment in accordance with the present invention; and FIG. 11B is a diagram of the inputs and outputs of a phase generator shown in FIG. 11A.

DESCRIPTION OF EXEMPLARY EMBODIMENTS AND BEST MODE

The present invention provides a variable delay circuit for the internal clock of the chip that is easily adjustable and in which the rising edge of a future stage generates the falling edge of the current stage.

Figure 1:
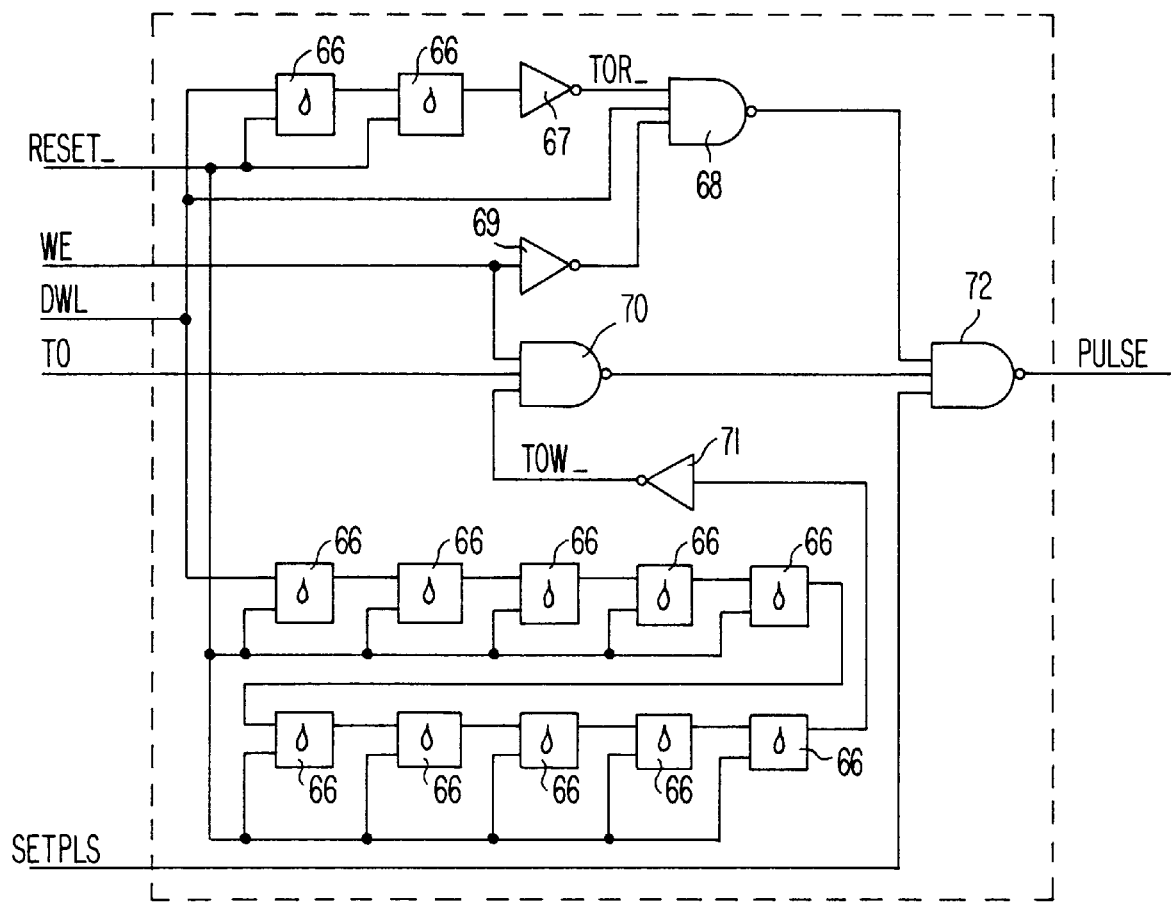
FIG. 1 is a circuit diagram of a conventional pulse generator.
Figure 2:
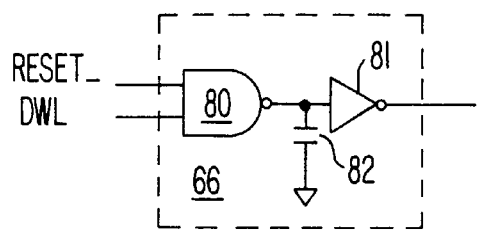
FIG. 2 is a detailed circuit diagram of a delay element shown in FIG. 1.
Figure 4A:
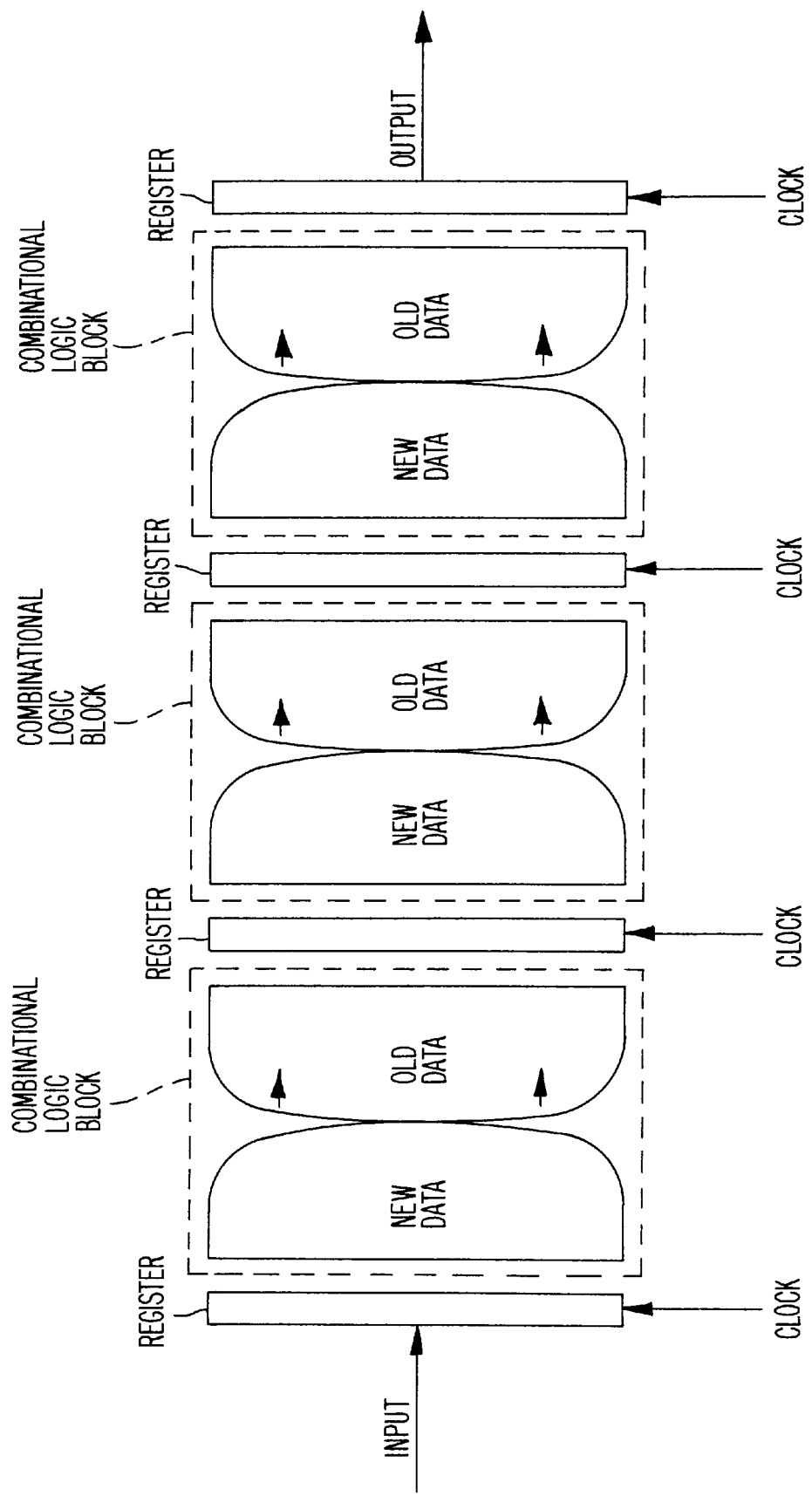
FIG. 4A is a schematic diagram illustrating a regular pipelining technique.
Figure 4B:
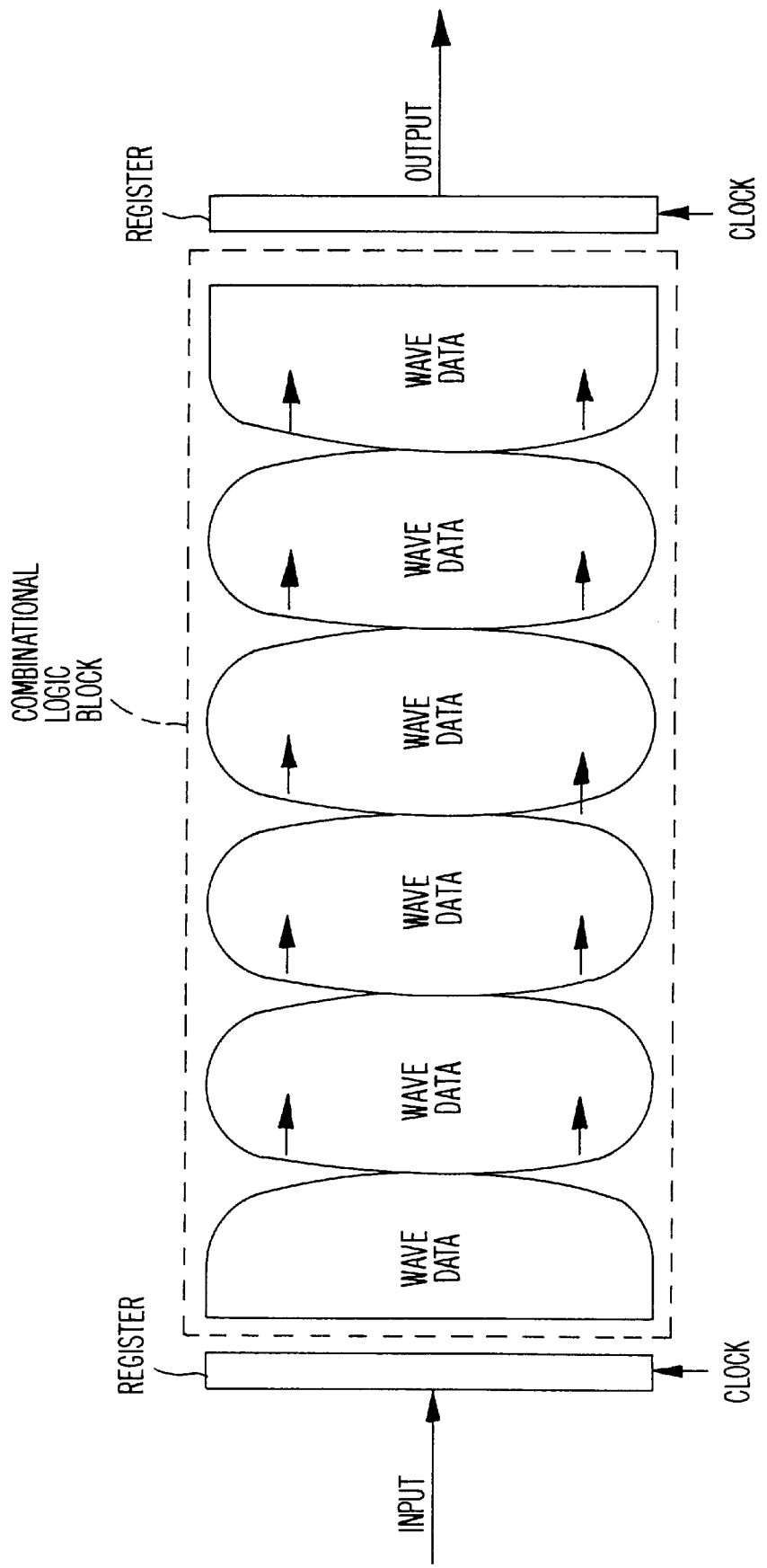
FIG. 4B is a schematic illustrating a conventional wave pipelining technique.
Figure 5:
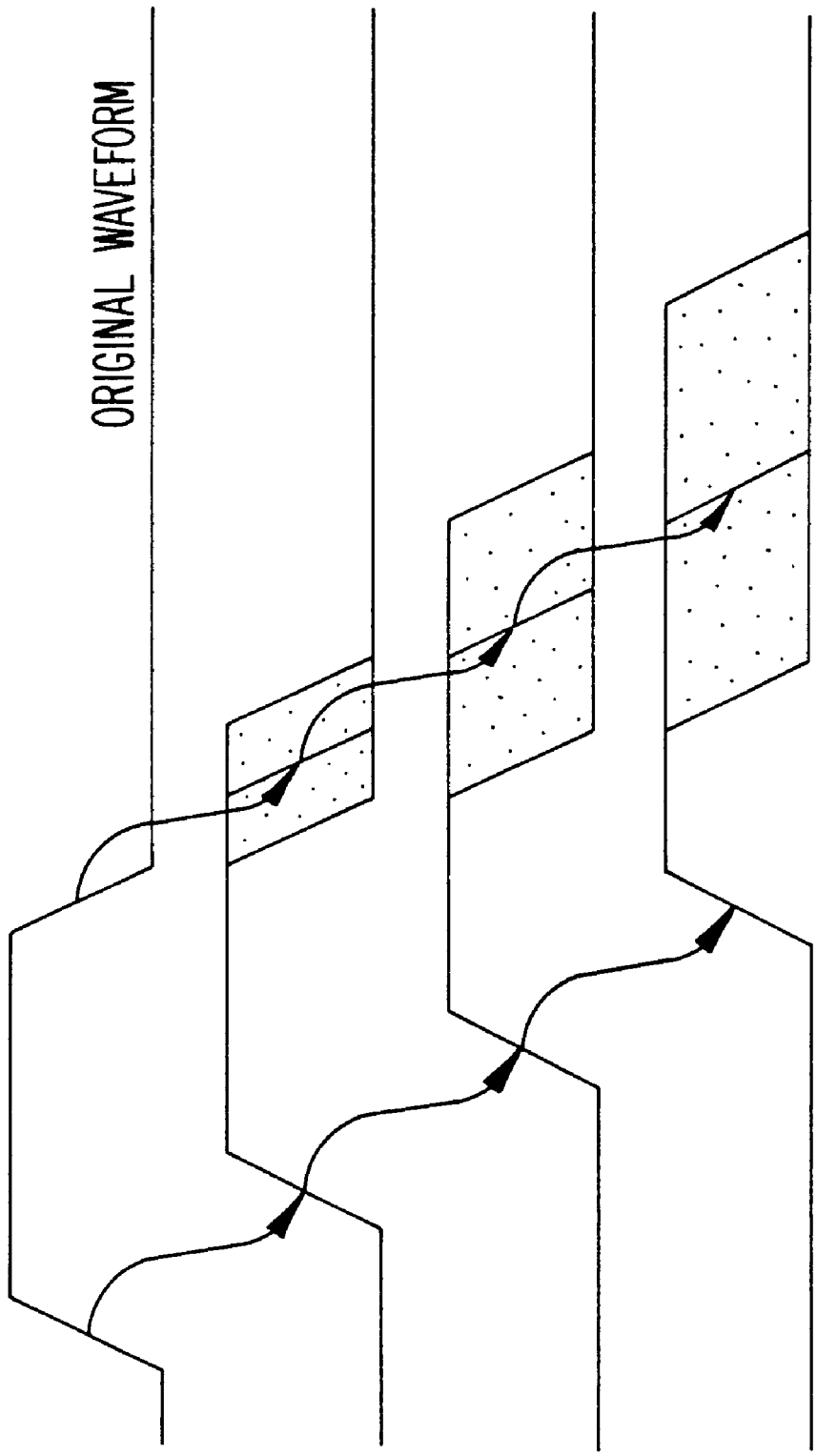
FIG. 5 is a diagram of a conventional wave pipe waveform.
Figure 6A:
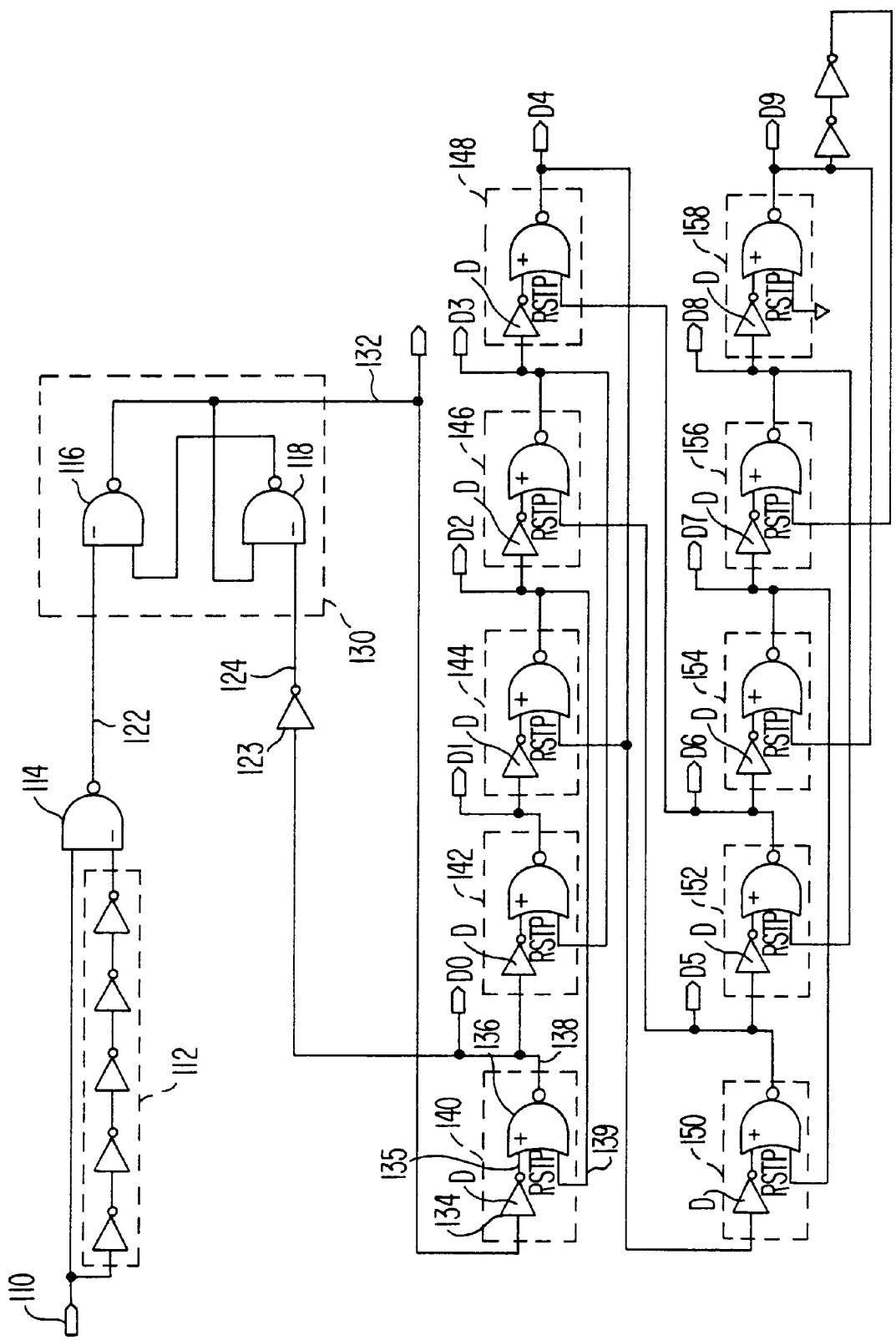
FIG. 6A is a circuit diagram of an exemplary embodiment of a tunable pulse generator in accordance with the present invention
Figure 6B:
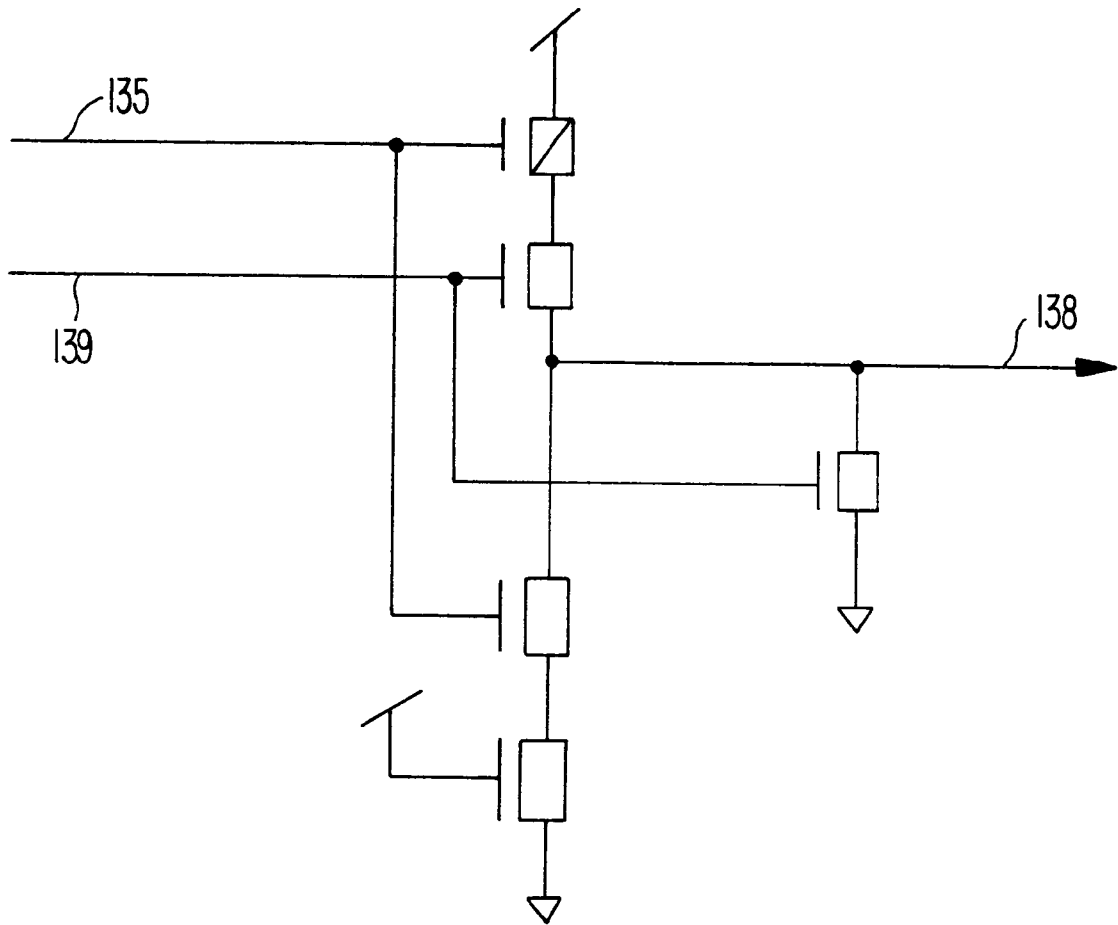
FIG. 6B is a detailed circuit diagram of a NOR gate element shown in FIG. 6A.
Figure 6C:
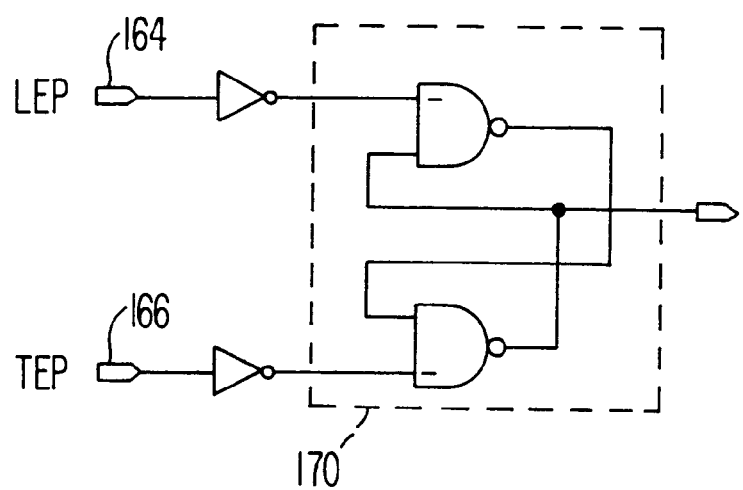
FIG. 6C is a circuit diagram of the portion of an exemplary embodiment of a tunable pulse generator in accordance with the present invention that establishes the pulse width and delay of an output waveform.

FIGS. 6A, 6B, and 6C show an exemplary embodiment of a pulse generator comprising a delay circuit in accordance with the present invention. An input waveform having an unknown duty cycle is provided to the self-reshaping wave pipeline at terminal 110. The input waveform signal is then processed at a bank of buffer inverters 112 and an AND-inverter 114 to produce a one-shot pulse signal (i.e., a pulse of one width) at terminal 122. The one-shot creates a waveform having a predetermined pulse width and an independent duty cycle. The one-shot is provided into a flip-flop, preferably a set-reset (SR) latch 130 comprising NAND gates 116 and 118. The SR latch 130 has a set input terminal 122, a reset input terminal 124, and a true output terminal 132. The output of the SR latch 130 is provided into a series of "n" delay stages 140, 142, 144, 146, 148, 150, 152, 154, 156, and 158; i.e., in the exemplary embodiment, n=10 delay stages. Although the described embodiment has only ten delay stages, any number of delay stages can be used. Each delay stage has (as shown in representative delay stage 140) an inverter 134, a NOR gate 136, an input 135, an output 138, and a reset 139. A delay signal is provided to the NOR gate along with a reset signal. An output signal is generated at the output terminal. The output of the first stage (delay stage 140) feeds back to the SR latch 130 through an inverter 123 to reset the SR latch 130.

In the exemplary embodiment, the output of the delay stage "n" feeds back to the reset of the delay stage "n−2". For example, the output of delay stage 144 feeds back to the reset of delay stage 140. In other words, after a particular stage has evaluated data and sent it to the next stage in the pipeline, that stage is reset using a feedback signal from a subsequent stage. Thus, the output of each of the delay stages initially changes from a first logic state, low, to a second logic stage, high, during the beginning of a pulse, or at the leading edge of the pulse. The output of each delay stage switches back to the first logic state, or the trailing edge of the pulse, upon receipt of a feedback signal from a subsequent delay stage.

Although the exemplary embodiment described herein uses feedback from the delay stage "n−2" to the delay stage "n" to trigger the change in logic state from high to low (the trailing edge pulse), it should be noted that, in accordance with the present invention, "n" delay stages can used, "n" being an integer greater than 1, and the delay stage output signal from the (n−i) stage is fed back to the reset terminal of the (n−(i+j)) stage as the reset signal, "i" being a whole number between 0 and (n−2), and "j" being an integer between 1 and (n−i−1).

Figure 7:
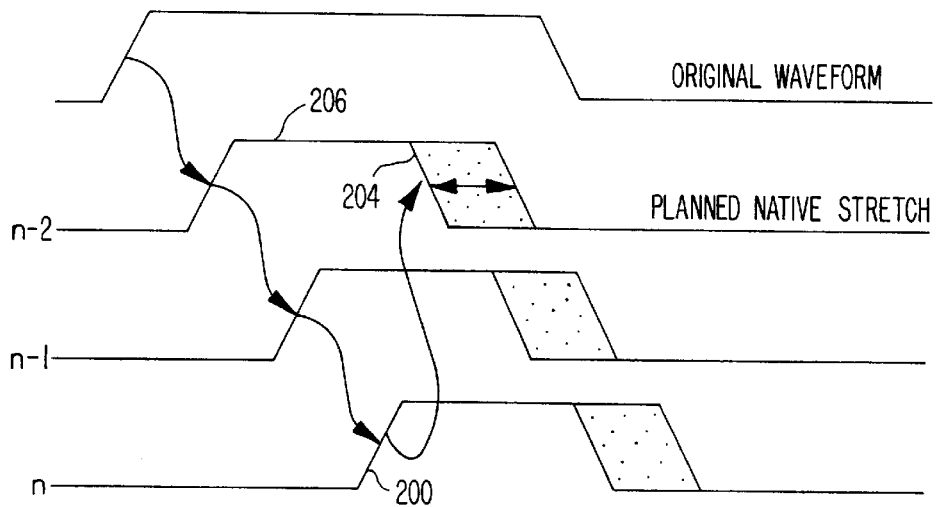
FIG. 7 is a diagram of a self-reshaping wave pipe waveform in accordance with the present invention.

A portion of the self-reshaping wave pipeline in accordance with FIG. 6A is shown in FIG. 7. The feedback path of the exemplary embodiment uses the rising edge 200 of the pulse in delay stage "n" to terminate the pulse in delay stage "n−2" by triggering the falling edge 204 of the pulse in delay stage "n−2". Each stage has a planned high pulse stretch 206 such that the reset triggered by the delay stage "n+2" is earlier than the end of the pulse 206. Therefore, at each stage of the pipe, the pulse maintains complete integrity. Thus, in the present invention, the wave characteristics depend only on the rising edge of the pulse because the rising edge of the pulse of a future stage generates the falling edge of the current stage.

FIG. 6B shows a detailed circuit diagram of a NOR gate (e.g., NOR gate 136) shown in FIG. 6A. The circuit of FIG. 6B is used to achieve the "planned native stretch" of FIG. 7.

When the reset 139 is held low, and the clock (input 135) is turned off (high), the output takes longer to fall. In this manner, in normal operation, the rise of the reset 139 turns off the output 138. Thus, the circuit is controlled only by rising edges. Using only one edge prevents drift and other types of distortion from changing the pulse width. Instead of only using rising edges to control the pulse generator, falling edges can also be used in a similar manner. The NOR element in each delay stage is inherently asymmetrical which prevents the pulse width from shrinking.

The pulse width and delay of the output waveform are established using another SR latch 170 as shown in FIG. 6C. FIG. 6C is fully controlled by rising edges. The leading edge pulse (LEP) of the final delayed waveform from the output of one of the delay stages "J" is provided to one input 164 of the SR latch 170. The trailing edge pulse (TEP) from the output of another delay stage "K" ("K" being treater than "J") is provided to the other input 166 of the SR latch 170. When the clock wave reaches tap "J", the output of FIG. 6C turns on. When the clock wave later reaches tap "K", the output of FIG. 6C turns off. Because of the integrity of the propagating wave pulse, each tap of the SR latch 170 represents the same amount of delay. Based on the input of the LEP and the TEP, the SR latch 170 produces an output pulse which is applied to an output block (not shown). In a preferred embodiment, the output of delay stage "n" is provided to the LEP input 164 and the output of delay stage "n + a positive integer" is provided to the TEP input 166.

Figure 8:
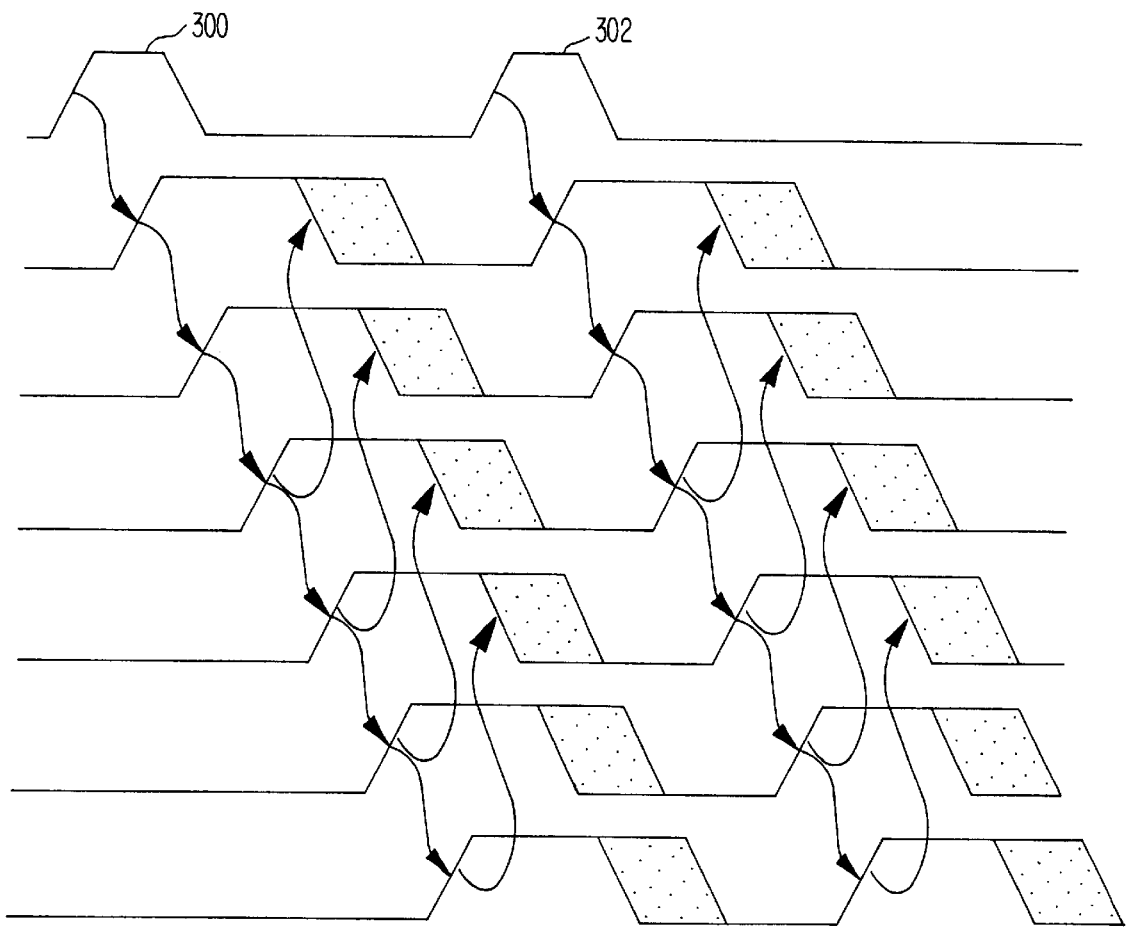
FIG. 8 is another diagram of a self-reshaping wave pipe waveform in accordance with the present invention.

The feedback technique of the present invention allows another waveform to enter the pipe. Thus, there can be several waves 300, 302 moving down the delay pipeline simultaneously, as shown in FIG. 8. This multiple waveform and scalability allows waves 300, 302 to be propagating in the next cycle in synchronous systems.

Figure 9:
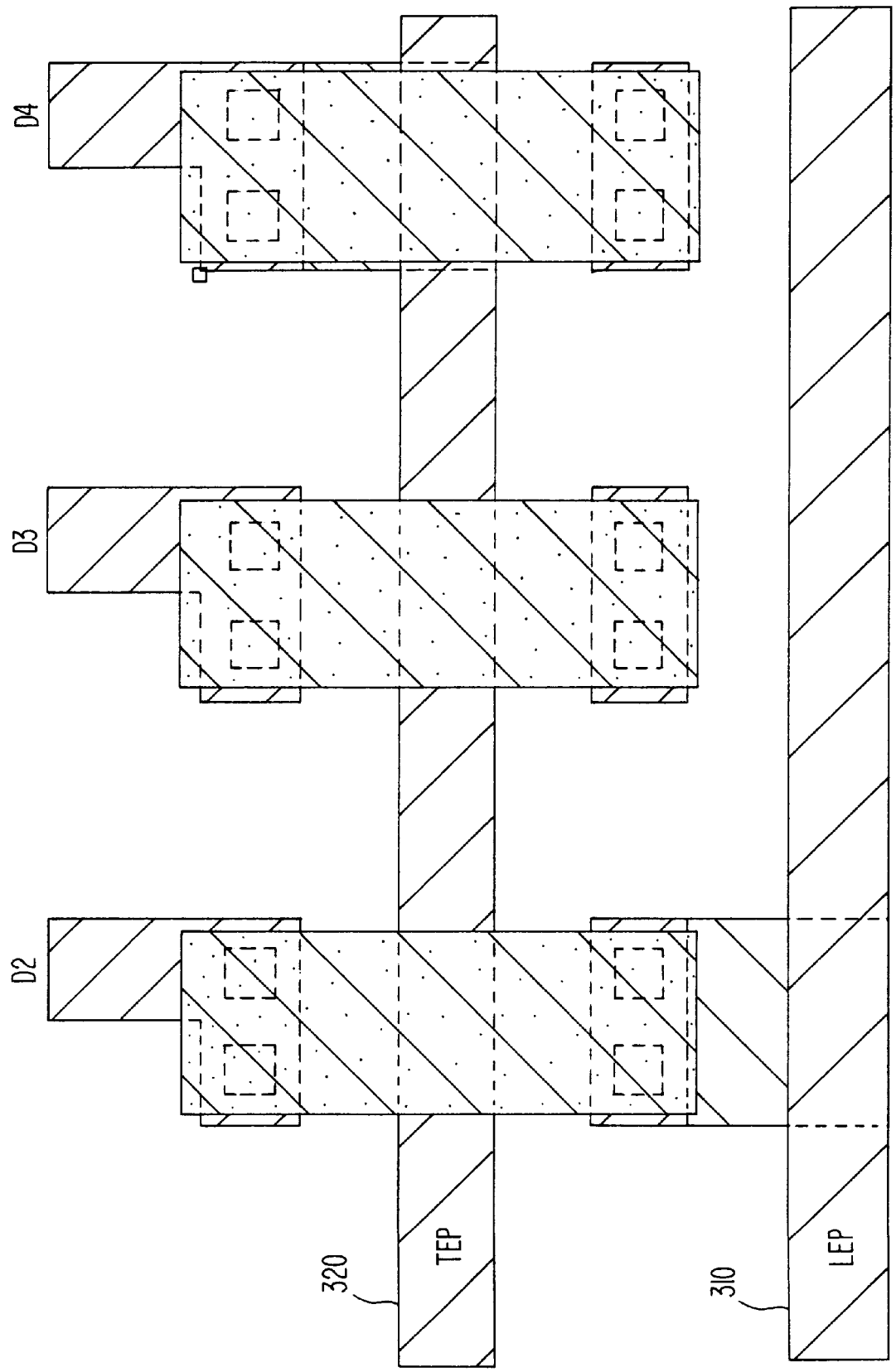
FIG. 9 is a design layout of taps that provide input to a set-reset (SR) latch in accordance with the present invention.

FIG. 9 shows a design layout of taps 164 and 166 that provide input to the SR latch 170 of FIG. 6C. The layout is constructed such that each tap point is exposed on metal to one edge of the circuit. The LEP line 310 (corresponding to input 164 of FIG. 6C) and the TEP line 320 (corresponding to input 166 of FIG. 6C) are brought along the same edge of the circuit. The lines 310 and 320 can be connected to any of the delay stage outputs using a metal block and a back-end alignment technique. In FIG. 9, LEP line 310 is connected to delay stage D2 and TEP line 320 is connected to delay stage D4. Delay stages D2 and D4 correspond to two delay stages "n−2" and "n", as described above with respect to FIG. 6A. Delay stage D3 corresponds to delay stage "n−1" and is not used in this example to determine the pulse width and delay of the output waveform. The design of the embodiment leads to ease of tunability in metal patches of a die revision. The final output of the circuit is the output of the SR latch 170 that is buffered to drive the appropriate load.

FIGS. 10A–11B show a further exemplary embodiment of a tunable pulse generator in accordance with the present invention. This embodiment provides finer tuning control with smaller taps and uses both leading edges and falling edges to trigger the pulse change. Both rising and falling edges are used in order to make[]the granularity finer on delay taps. For consistency with the embodiment described above, in the example shown in FIGS. 10A–11B, rising edges are controlled using rising edges of other stages, and falling edges are controlled using falling edges of other stages.

Figure 10A:
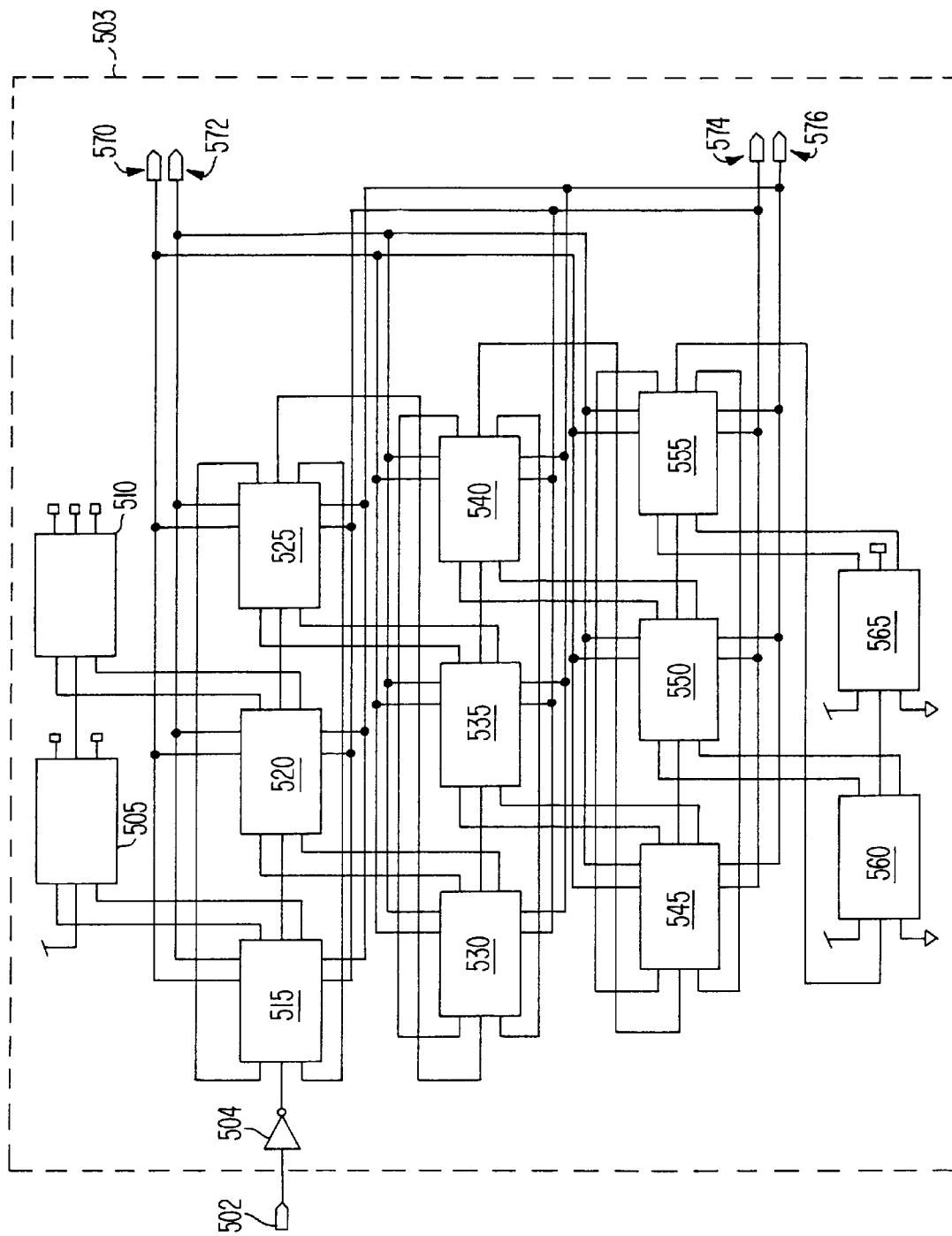
FIG. 10A is a block diagram of a further exemplary embodiment in accordance with the present invention.

FIG. 10A shows an exemplary tunable clock delay circuit in accordance with the present invention. There are 8 back-ins on one delay pipe. The appropriate delay taps are tied to leading edge bundled port 570, 572 and trailing edge bundled port 574, 576. Port 570 functions similar to port 574, and port 572 functions similar to port 576. Two ports each are used for the leading edge and trailing edge ports for improved accuracy. The ports 570 and 574 represent the even delay stages which output a rising edge. The ports 572 and 576 represent the odd delay stages which output a falling edge.

Self resetting logic is used. Specifically, an input waveform is provided to the circuit at 502 and is processed at an inverter 504. Dummy loads 505, 510, 560, and 565 are used to keep the pulse integrity running longer. Blocks 515, 520, 525, 530, 535, 540, 545, 550, and 555 each represent a bank of two delay stages. The waveform passes through three banks of delay stages and then is reshaped.

Figure 10B:
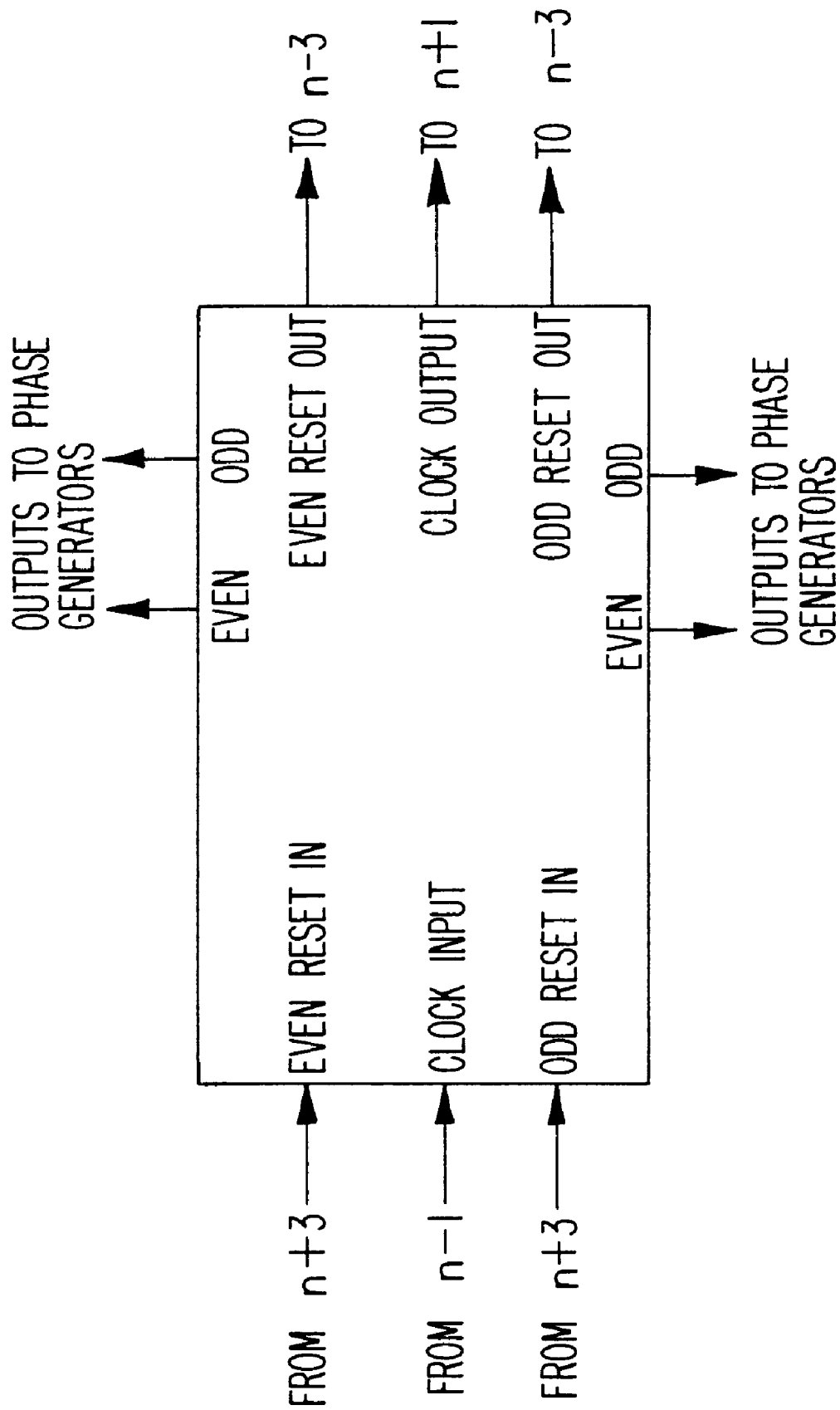
FIG. 10B is a diagram of the inputs and outputs of a delay block shown in FIG. 10A.

FIG. 10B is a diagram of an exemplary bank of delay stages shown in FIG. 10A, for example block 530. The inputs into the bank of delay stages are an even reset and an odd reset which are provided from delay stage "n+3", and a clock input provided from delay stage "n−1." The even and odd outputs are provided to the phase generators in FIG. 11A. Also provided as outputs are an even reset and an odd reset provided to delay stage "n−3", and a clock output provided to delay stage "n+1."

FIG. 11A shows an exemplary clock generation circuit for control circuits and uses the delay circuit 503 of FIG. 10A. The outputs of delay circuit 503 are provided to the phase generators 610, 620, 630, 640, and 650. These phase generators control the leading edges and the trailing edges of the pulses. To avoid two generators being attached to a single port, two ports each are used for the leading edge and trailing edge ports in FIG. 10A. Double-loading a timing phase tap affects its accuracy.

FIG. 11B is a diagram of an exemplary phase generator 610, 620, and 640 of FIG. 11A. The output turns on when LEP rises or when LEN falls. The output turns off when TEP rises or when TEN falls. In normal use, only LEP or LEN is used, and the other is tied off. This is also the case for TEP and TEN.

In phase generator 640, LEP is tied to OFFP to hold it inactive. The output turns on when E01N falls, and turns off when E10P rises, and TEN is tied off with OFFN. In other words, the output is on from time 01 to time 10.

In some uses, the pulse width is disregarded and only the leading edge is used. For these situations, phase generators 630 and 650 are used. Phase generators 630 and 650 only have LEP and LEN inputs. Only one of these inputs is used, and the output is on for the natural duration of the pulse propagating through the wave pipe 503.

In FIG. 11A, OFFN is generated by RHI, and OFFP is generated by RLO. The time 00 tap is used by phase generators 610 and 650. Thus, the outputs are doubled so that a tap does not have to be shared. This results improved accuracy.

The embodiment of FIGS. 10A–11B use every delay stage instead of every other delay stage as in the embodiment described with respect to FIG. 6A. Functionally, FIG. 10A is related to FIG. 6A, and phase generators 610–650 are related to FIG. 6C.

The present invention provides the advantage that the same delay and pulse shape exist between all stages. Moreover, the present invention is independent of the duty cycle of the input waveform and is scaleable. The present invention has a width and delay that are easily tunable with metal. Moreover, the present invention allows a delayed waveform of a current cycle to be propagating during the next cycle.

Although illustrated and described herein with reference to certain specific embodiments, the present invention is nevertheless not intended to be limited to the details shown. Rather, various modifications may be made in the details within the scope and range of equivalents of the claims and without departing from the invention. Consistent with the invention, for example, a variety of differing pulse widths may be selected and a variety of differing delay elements may be used, to process desired input signals.

What is claimed:

1. A pulse generator receiving an input signal to generate an output signal, comprising:
    a first delay stage having:
        an input terminal responsive to the input signal,
        a reset terminal receiving a second delay stage output signal from a second delay stage, and
        an output terminal generating a first delay stage output signal which changes state from a first logic state to a second logic state after a first predetermined amount of time and which changes state from the second logic state to the first logic state upon being reset by the second delay stage output signal;
    said second delay stage having:
        an input terminal receiving the first delay stage output signal, and
        an output terminal generating said second delay stage output signal which changes state from a first logic state to a second logic state after a second predetermined amount of time; and
    feedback means, coupled to said second delay stage, for providing the second delay stage output signal to said reset terminal of said first delay stage.

2. The pulse generator of claim 1, further comprising pulse output means, coupled to said output terminals of said first delay stage and said second delay stage, for generating an output pulse waveform.

3. The pulse generator of claim 2, wherein said pulse output means comprises a set-reset latch having a set terminal coupled to said output terminal of said second delay stage, a reset terminal coupled to said output terminal of said first delay stage, and a true output terminal.

4. The pulse generator of claim 1, wherein the second delay stage output signal triggers the transition from the second logic state to the first logic state of the pulse at said first delay stage.

5. The pulse generator of claim 4, wherein said second delay stage output signal is responsive to the transition from the first logic state to the second logic state of the pulse at said second stage.

6. The pulse generator of claim 1, wherein each delay stage includes an inverter coupled to said input terminal and a NOR logic gate with three terminals respectively coupled to the output of said inverter, said reset terminal, and said output terminal.

7. The pulse generator of claim 1, wherein the flip-flop is a set-reset latch having a set input, a reset input, and a true output.

8. The pulse generator of claim 1 further comprising input means for generating a pulse having a predetermined pulse width responsive to the input signal.

9. The pulse generator of claim 8 further comprising a flip-flop receiving the pulse from said input means and generating a flip-flop output signal, the first delay stage output signal feeding back to said flip-flop to reset the flip-flop output signal.

10. A delay circuit for a pulse generator comprising:
    "n" delay stages, "n" being an integer greater than 1, each delay stage having:

an input terminal, a reset terminal receiving a reset signal from another delay stage, and an output terminal generating a delay stage output signal which changes state from a first logic state to a second logic state after a predetermined amount of time and which changes state from the second logic state to the first logic state upon receipt of the reset signal, wherein the delay stage output signal from the (n−i) stage is fed back to the reset terminal of the (n−(i+j)) stage as the reset signal, "i" being a whole number between 0 and (n−2) and "j" being an integer between 1 and (n−i−1).

11. The delay circuit of claim 10, wherein each delay stage has an inverter coupled to said input terminal and a NOR logic gate with three terminals respectively coupled to the output of said inverter, said reset terminal, and said output terminal.

12. The pulse generator of claim 10 further comprising a plurality of pulse output means, each pulse output means coupled to respective output terminals of at least some of the "n" delay stages.

13. A method for performing logic operations on data in a pipeline of logic circuitry, said pipeline comprising a plurality of delay stages, comprising the steps of:

receiving a first data signal into a first stage of logic circuitry;

performing a logic operation on said first data signal with said first stage of logic circuitry to produce a second data signal which changes state from a first logic state to a second logic state after a first predetermined amount of time;

providing said second data signal to a second stage of logic circuitry;

performing a logic operation on said second data signal with said second stage of logic circuitry to produce and output a third data signal which changes state from a first logic state to a second logic state after a second predetermined amount of time; and providing the third data signal to said first stage of logic circuitry, thereby causing the second data signal to change state from the second logic state to the first logic state.

14. The method of claim 13, wherein the first stage and second stage of logic circuitry each have an inverter coupled to a NOR logic gate with a first input and a second input, and the third data is fed back to the first input of the NOR logic gate.

15. The method of claim 13, wherein the first data changes state from the second logic state to the first logic state upon receipt of the third data.

16. A delay circuit for a pulse generator comprising:

a series of delay stages each having:

an input terminal receiving a delay stage output signal from a previous delay stage in the series, a reset terminal receiving a reset signal from a subsequent delay stage in the series, and an output terminal generating a delay stage output signal which changes from a first logic state to a second logic state, and which changes from the second logic state to the first logic state upon being reset by the reset signal from the subsequent delay stage, wherein, the delay stage output signal from the subsequent delay stage feeds back to the reset terminal as the reset signal.

* * * * *